(12) United States Patent
Giovanelli (10) Patent No.: US 9,714,957 B2
(45) Date of Patent: Jul. 25, 2017

(54) HIGH VOLTAGE DIVIDER (71) Applicant: SIEMENS AKTIENGESELLSCHAFT, Munich (DE)

(72) Inventor: Lorenzo Giovanelli, Vado Ligure SV (IT)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 15/025,352

(22) PCT Filed: Aug. 19, 2014

(86) PCT No.: PCT/EP2014/067634
§ 371 (c)(1),
(2) Date: Mar. 28, 2016

(87) PCT Pub. No.: WO2015/043835
PCT Pub. Date: Apr. 2, 2015

(65) Prior Publication Data
US 2016/0238634 A1    Aug. 18, 2016

(30) Foreign Application Priority Data

Sep. 27, 2013   (EP) ...................................... 13186318

(51) Int. Cl.
*G01R 15/18*      (2006.01)
*G01R 15/06*      (2006.01)
(Continued)

(52) U.S. Cl.
CPC ........... *G01R 15/06* (2013.01); *G01R 15/142* (2013.01); *G01R 15/16* (2013.01); *H03H 7/24* (2013.01); *H01G 2/14* (2013.01); *H01G 4/40* (2013.01)

(58) Field of Classification Search
CPC ... G01R 1/20; G01R 1/22; G01R 1/16; G01R 5/04; G01R 5/16; G01R 1/203; G01R 15/146; G01R 19/0007
(Continued)

(56) References Cited

U.S. PATENT DOCUMENTS 6,919,717 B2   7/2005  Ghassemi
2005/0206495 A1*  9/2005  Nagaoka .................. H03H 7/24
                                    338/162
(Continued)

FOREIGN PATENT DOCUMENTS

EP    1295133 A1    3/2003
EP    1295133 B1    7/2004
(Continued)

OTHER PUBLICATIONS

Ghassemi, Foroozan et al., "Harmonic Voltage Measurements Using CVTs", IEEE Transactions on Power Delivery, 2005, pp. 443-449, vol. 20, No. 1.
Schmid, Joachim et al., "Application of Non Conventional Voltage and Currents Sensors in High Voltage Transmission and Distribution Systems."; 2011 IEEE International Conference, Smart Measurements for Future Grids (SMFG), 2011, pp. 64-68.
"Resistive Capacitive Voltage Transformers for Power Quality Applications"; pp. 1-4; 2012 URL: http://www.trenchgroup.com/content/download/1382/11376/file/AC%20Voltage%20Divider.pdf.
"The Proven Power", TCVT Capacitor Voltage Transformer, TCC Coupling and TRV Capacitors; pp. 1-8; 2012 URL: http://www.trenchgroup.com/content/download/1387/11386/file/TCVT%20and%20TCC_International%20Brochure.pdf.
(Continued)

*Primary Examiner* — Jermele M Hollington
*Assistant Examiner* — Raul Rios Russo
(74) *Attorney, Agent, or Firm* — Laurence Greenberg; Werner Stemer; Ralph Locher (57) ABSTRACT

An HV divider stepping down an input high voltage in HV systems includes a primary part with first and second assemblies within an insulator and a divider input terminal. The first assembly is a first capacitor stack having first high and middle voltage capacitors. The second assembly has a second capacitor stack and resistor stack in parallel. The second capacitor stack has second high and low voltage capacitors. The resistor stack has high and low voltage resistors. The secondary part has an electromagnetic unit and a secondary part output set has: a first output terminal subset, (Continued)

deriving from a first intermediate terminal processed through electromagnetic unit, to provide a first output voltage subset for measuring amplitude of the input voltage at nominal frequency range; a second output terminal, deriving from a second intermediate terminal, to provide a second output voltage for measuring waveform of the input high voltage.

5 Claims, 4 Drawing Sheets

(51) Int. Cl.
*G01R 15/14* (2006.01)
*G01R 15/16* (2006.01)
*H03H 7/24* (2006.01)
*G01R 5/14* (2006.01)
*H01G 4/40* (2006.01)
*H01G 2/14* (2006.01)

(58) Field of Classification Search
USPC ... 324/76.11–76.83, 115, 126, 127, 129, 149
See application file for complete search history.

(56) References Cited

U.S. PATENT DOCUMENTS

| | | | |
|---|---|---|---|
| 2006/0012382 A1* | 1/2006 | Yakymyshyn | G01R 15/06 324/705 |
| 2009/0175419 A1* | 7/2009 | Jedlitschka | G05F 1/63 378/111 |
| 2010/0253366 A1 | 10/2010 | Deibele et al. | |
| 2014/0159701 A1 | 6/2014 | Nabielec | |

FOREIGN PATENT DOCUMENTS

| | | |
|---|---|---|
| WO | 0184164 A1 | 11/2001 |
| WO | 2013026805 A1 | 2/2013 |

OTHER PUBLICATIONS

"HVDC Divider—Compensated Voltage Divider for HVDC transmission systems"; pp. 1-4; 2012 URL: http://www.trenchgroup.com/content/download/1342/11179/file/DC%20Voltage%20Divider.pdf.

* cited by examiner

HIGH VOLTAGE DIVIDER

BACKGROUND OF THE INVENTION

Field of the Invention

The present invention relates to a high-voltage (HV) divider used to obtain lower voltage signals in electrical HV networks.

In electrical HV networks, capacitor voltage transformers (CVTs) are electrical equipment employed to step down HV signals so as to provide lower voltage output signals for line measuring and/or protection devices or to be used as coupling capacitors for HF communication signals.

Figure 1:
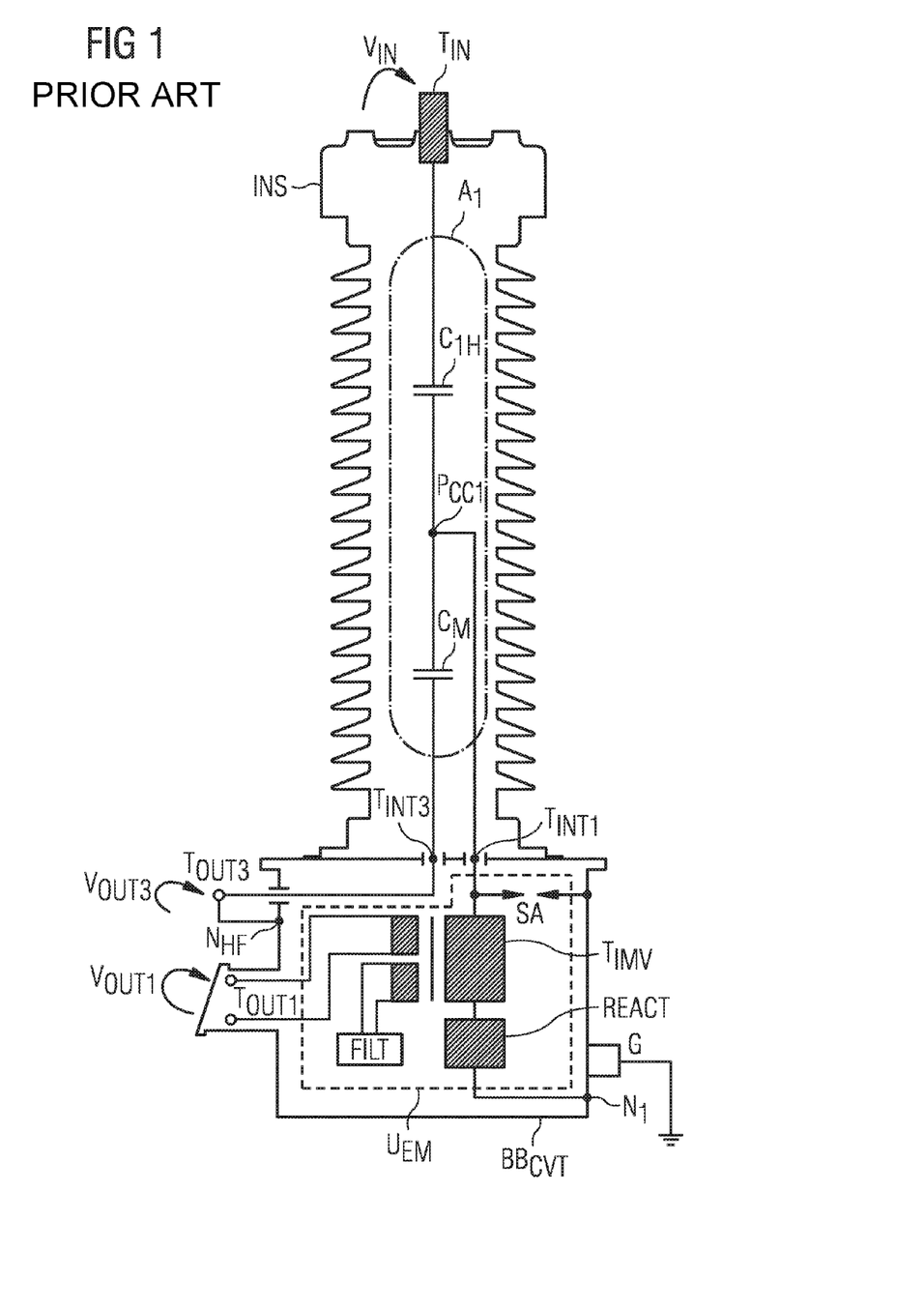
FIG. 1 is a schematic circuit diagram of a conventional CVT transformer (prior art, previously described)

The main elements of a conventional CVT transformer as, for example, one designed by the Trench Group, called TCVT, are schematically illustrated in FIG. 1.

In its most basic form, a conventional CVT transformer comprises:
- a capacitor stack comprising two capacitors, a HV capacitors $C_{1H}$ and middle-voltage capacitor $C_M$ across which the transmission line signal is split;
- an inductive element REACT acting as compensating reactor aimed at tuning the device to the line frequency;
- an intermediate inductive intermediate voltage transformer $T_{IMV}$ to further step down the voltage.

The CVT transformer shown in FIG. 1 consists of two main parts, a capacitor voltage divider A1 contained inside an insulator body INS and an electromagnetic unit $U_{EM}$ contained inside a base-box $BB_{CVT}$.

The capacitor voltage divider A1 comprises the capacitor stack and a link connecting a point $P_{CC1}$ between to the capacitors $C_{1H}, C_M$ to a first intermediate terminal $T_{INT1}$ which is one of the input terminals of the base-box $BB_{CVT}$. The capacitors $C_{1H}$, $C_M$ are designed to reduce the input primary voltage $V_{IN}$ till a value between 5 and 10 KV useful to energize the inductive intermediate voltage transformer $T_{IMV}$ contained in the electromagnetic unit $U_{EM}$.

The insulation bodies INS of the capacitor voltage divider A1 of the CVT products developed by the Trench Group have typically an external insulation using porcelain or composite insulators and an internal capacitor insulation comprising oil and polypropylene with or without paper.

The electromagnetic unit $U_{EM}$ typically comprises a surge arrester SA, the inductive intermediate voltage transformer $T_{IMV}$, the inductive element REACT with a neutral end terminal N1, and a filter circuit FILT against ferro-resonances oscillations. Plate G denotes the ground terminal of the base-box $BB_{CVT}$.

The input high voltage $V_{IN}$ is applied at input HV primary terminal $T_{IN}$ and a set of output voltages $V_{OUT1}$, $V_{OUT3}$ are measured at a set of output terminals $T_{OUT1}$, $T_{OUT3}$ located at the base-box level. Output voltage $V_{OUT3}$ is provided at HF output terminal $T_{OUT3}$ (derived from another intermediate terminal $T_{INT3}$) and it is employed for HF communication signals for coupling capacitor purposes. Terminal $N_{HF}$ is the earthing link for the HF output terminal $T_{OUT3}$ (where the illustrated link is to be disconnected in case a HF communication device needs to be connected to it). Subset of output voltages $V_{OUT1}$, measured at output terminal subset $T_{OUT1}$, is used for measuring the amplitude of the applied input voltage $V_{IN}$ at the nominal frequency range (e.g. 50 or 60 Hz), e.g. for performing voltage measurements and/or for supplying voltage to line protection devices.

The output terminal subsets $T_{OUT1}$ is denoted with the term "subset" since output voltage V1 may conveniently be supplied on more than one terminal according to customer requirements who may for example wish you to have two terminals to be connected to a voltage measurement device and two other terminals to be connected to protection devices.

CVT transformers are normally used on HV systems with an applied input primary voltage $V_{IN}$ in the range of 52 to 800 kV. For different primary voltage ranges, only $C_{1H}$ needs to be modified so that, advantageously, a standard inductive intermediate voltage transformer $T_{IMV}$ can be used for a large range of primary voltage values.

Nowadays, in the majority of HV networks, conventional CVT transformers are used for the already mentioned purposes (e.g. HV measurements, protective relay, HF communication) as a conventional solution.

In recent years, in electrical power systems, the assessment of power quality has become a key requirement for the modern management of electrical power systems, being power quality a major concern for electricity providers and their customers. Power quality is evaluated in compliance with industry specifications for determining the harmonic pollution level in the system. Power system harmonics are integer multiples of the fundamental power system frequency and are created by a large variety of non-linear devices connected to the electrical power systems.

The risks involved with harmonics pollution are voltage distortions leading to several power quality disturbances, including for example:
- increased heating in the equipment and conductors;
- misfiring in variable speed drives;
- torque pulsations in motors;
- increased losses;
- damage to electrical equipment;
- malfunction of metering and control equipment.

Hence, harmonics pollution, by affecting power equipment performances, is often the cause for customer dissatisfaction, for load and revenue losses.

In order to ensure that power quality criteria are met, energy providers need to determine the origin of the power quality disturbances. To do that, the harmonics level in HV systems need to be identified and measured with a reliable image of the voltage waveform on the HV line.

Unfortunately, the above described conventional CVT transformers do not provide the industry-required sufficient accuracy for the measurement of voltage harmonics since they provide a poor image of the harmonics on HV networks. In fact, CVT transformers are tuned to resonate at the nominal system frequency (i.e. 50 Hz or 60 Hz) so that the CVT accuracy is obtained on a narrow frequency band. Since, the lowest frequency resonance appears at around a few hundreds Hz, conventional CVTs cannot thus be used for harmonic measurements.

In order to be able to at least monitor harmonics through conventional CVTs, in the art have been introduced some equipment which are modifications of conventional CVTs with the addition of extra devices.

For example, a first type of such modified CVT is a conventional CVT comprising a harmonic monitoring terminal as the one developed by the Trench Group. A second known type of modified CVT is a conventional CVT comprising a PQ-Sensor™. With such types of modified CVT transformers it is possible to monitor harmonics in the HV system while simultaneously being still able to carry out the conventional tasks of CVTs (e.g. HV measurements, protective relay, HF communication).

The first type of modified CVT equipment contains a harmonics monitoring terminal (HMT) which comprises among other elements a third capacitor. The Trench Group designed such type of modified CVT equipment under the product name TCVT with HMT terminal. Performances in harmonics monitoring of such equipment product are an accuracy of about ±5% in a frequency range of about 50 Hz to 3 kHz.

The second type of modified CVT equipment contains a PQ-Sensor™. The technology behind the PQ-Sensor™ can be found in the disclosures of document EP 1295133 B1 (2001, Ghassemi Foroozan) which discloses a CVT comprising current sensor means arranged to sense the current flowing in at least one capacitor of the CVT and measurements means arranged to provide from the sensed current values a measurement of the harmonic values of the applied input voltage.

For example, the Trench Group added such PQ-Sensor™ to its conventional CVT in order to market such a second type of modified CVT equipment product, e.g. under the product name TCVT with PQ Sensor™, such equipment product being suitable for different applications such as harmonics monitoring, revenue metering, protection and PLC. Performances in harmonics monitoring of such equipment product are an accuracy of about ±3% in a frequency range of about 50 Hz to 6 kHz.

In the art, in order measure voltage harmonics with high accuracy, the optimal solution used so far consists of precision HV resistor capacitor dividers (RCD), another type of HV instrument transformer.

Precision HV RCD dividers are voltage transformers that provide a low-voltage output proportional to the applied HV voltage input and are almost linear from DC up to more than 10 kHz: harmonics can be typically measured with an accuracy better than 1% and a phase deviation better than 1° over this frequency range.

Figure 2:
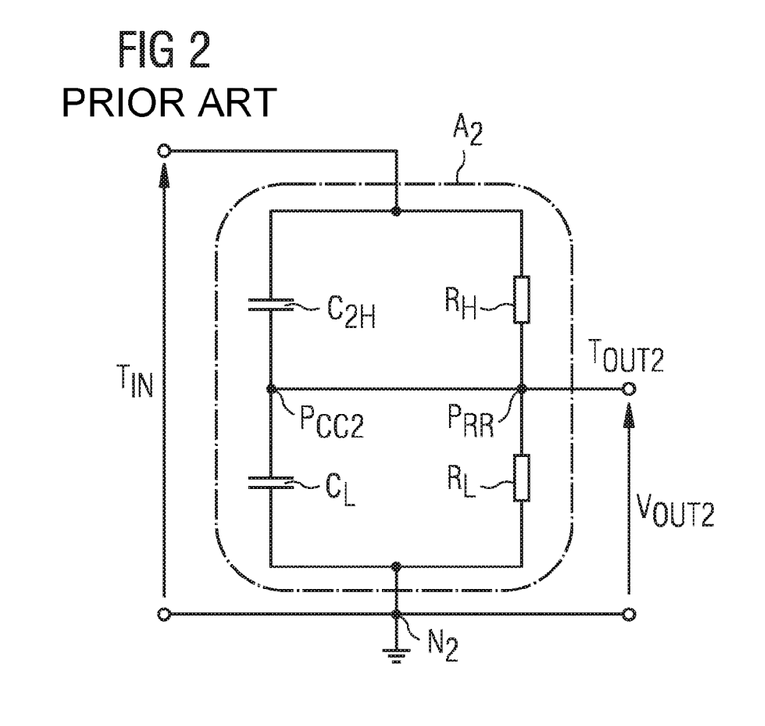
FIG. 2 is a schematic circuit diagram of a RCD divider (prior art, previously described)

FIG. 2 is a simplified electric circuit of an RCD divider. The RCD simplified circuit consists of an assembly A2 comprising a capacitor stack and a resistor stack, electrically connected in parallel to each other, and a link connecting point $P_{CC2}$ to point $P_{PR}$ then to a second output terminal $T_{OUT2}$. The capacitor stack comprises two capacitors $C_{2H}$, $C_L$ and the resistor stack comprises two resistors $R_H$, $R_L$. Point $P_{CC2}$ and point $P_{RR}$ are, respectively, a point $P_{CC}$ between the two capacitors $C_{2H}$, $C_L$ and a point $P_{RR}$ between the two resistors $R_H$, $R_L$. The input primary voltage $V_{IN}$ is applied at input terminal $T_{IN}$ and the second output voltage $V_{OUT2}$ is measured at output terminal $T_{OUT2}$ (where neutral terminal $N_2$ is grounded). The conditions that enable an accurate measure of the voltage waveform is the frequency independence of the transfer function $V_{OUT2}/V_{IN}$ which requires that: $R_H*C_{2H}=R_L*C_L$. Such RCD devices can be designed to give a frequency independent transformation ratio and phase angle over a frequency range up to at least 1 MHz and are also suitable for DC measurement.

The Trench Group developed a product family of precision HV RCD dividers under the product name RCVT, which are available for voltage levels from 24 kV up to 765 kV. Performances of such equipment product are an accuracy up to about 0.1%, in a frequency of about 0 to 50 kHz. Such RCVT product range cover all IEC and ANSI metering requirements: class 0.2 or lower and can also be used for protection purposes, according IEC or ANSI industry specifications.

Such equipment product is suitable for different applications such as harmonics metering, revenue metering and protection (low power).

RCVTs have typically an external insulation using porcelain or composite insulators and internal insulation using oil with paper-polypropylene or SF6 with polypropylene. RCVTs are not affected by the trapped charges phenomena.

Table 1 below summarizes at a glance the features of the three above described HV equipment types.

TABLE 1 summary of equipment features

| | TCVT + HMT | TCVT + PQ sensor ™ | RCD |
|---|---|---|---|
| AC Voltage Output (nominal frequency) | Yes | Yes | Yes (but low power only) |
| HF Communication | Yes | Yes | No |
| DC Voltage Output | No | No | Yes |
| Harmonics Measuring | Yes (accuracy of about ±5% in a frequency range of about 50 Hz to 3 kHz) | Yes (accuracy of about ±3% in a frequency range of about 50 Hz to 6 kHz) | Yes (accuracy of about ±0.1% in a frequency range of about 0 to 50 kHz) |

As summarized in Table 1, even if the above illustrated two types of modified CVT equipment enable harmonics metering functionalities, it is evident that, where high accuracy harmonics measurement and low-power is required, RCD-type equipment represents the optimal solution. On the other hand, where voltage measuring, voltage protection and HF communication functionalities are required, it is instead the CVT-type equipment which represents the desirable solution.

Hence, in HV networks where best performances are required, it is often the case that both equipment types of instrument transformers need to be installed, i.e. CVTs and RCDs.

Moreover, due to the strict power quality requirements of modern HV network management, energy providers are more and more required to install RCD transformers in electrical substations, in addition to the conventional or modified CVT transformers already present. Unfortunately, CVT and RCD transformers are HV equipment of large sizes due to their physical characteristics. This can prove to be a great problem in electrical substations which have a rigid layout and where space is a serious constraint.

BRIEF SUMMARY OF THE INVENTION

It is therefore aim of the present invention to overcome the above mentioned drawbacks, by providing a HV divider which provides at least some functionalities of the CVT whilst enabling a high accuracy harmonics measurement.

The aforementioned aim is achieved by a HV divider for stepping down an input high voltage in HV systems, wherein at the divider input terminal is applied the input high voltage and wherein, at the divider output terminal set, a set of output voltages are provided;
wherein said divider comprises a primary part and a secondary part electrically connected to each other so that the output of the primary part is the input of the secondary part;
wherein the input terminal of the primary part is the divider input terminal and the output the secondary part is the divider output set;
wherein the primary part comprises a first assembly and a second assembly included within insulating means and having for input the same input terminal which is the divider input terminal;

the first assembly being a first capacitor stack comprising a first high voltage capacitor and a middle voltage capacitor; the second assembly comprising a second capacitor stack and a resistor stack electrically connected in parallel to each other; the second capacitor stack comprising a second high voltage capacitor and a low voltage capacitor; the resistor stack comprising a high voltage resistor and a low voltage resistor;

wherein the output of the primary part is a set of intermediary terminals comprising at least:
  a first intermediate terminal connected to a point between the two capacitors of the first capacitor stack;
  a second intermediate terminal connected to a link connecting a point between the two capacitors of the second capacitor stack and a point between the two resistors of the resistor stack;
wherein the secondary part comprises an electromagnetic unit and wherein the secondary part output set comprises at least:
  a first output terminal subset, deriving from the first intermediate terminal processed through electromagnetic unit, arranged to provide a first output voltage subset to be used for measuring the amplitude of the input voltage at the nominal frequency range;
  a second output terminal, deriving from the second intermediate terminal, arranged to provide a second output voltage to be used for measuring the waveform of the input high voltage.

In invention embodiments, the HV divider may advantageously comprise:
  a third intermediate terminal connected to the output terminal of the first assembly;
  a third output terminal, deriving from the third intermediate terminal, arranged to provide a third output voltage to be used for high frequency communications.

In invention embodiments, the first capacitor stack and the second capacitor stack may conveniently physically be realized through two different column arrangements, the first column arrangement including a set of first-stack capacitor elements physically stacked together one above the other and electrically connected and the second column arrangement including a set of second-stack capacitor elements physically stacked together one above the other and electrically connected.

In invention embodiments, the first capacitor stack and the second capacitor stack may preferably be physically realized through one single column arrangement, the single column arrangement including a number of capacitor elements belonging to both capacitor stacks; wherein the capacitor elements of both capacitor stacks are physically stacked together one above the other together and wherein only the capacitor elements belonging to the same capacitor stack are electrically connected.

In invention embodiments, the electromagnetic unit may preferably comprise at least an inductive middle voltage transformer, a compensation reactor and a filter circuit. Embodiments of the invention enable to use only one HV instrument transformer equipment instead of two, whilst having the required functionalities. This leads to space and cost savings for energy providers at the HV electrical sub-stations. Savings are also achieved in terms of the equipment installation costs and civil works required at electrical sub-stations. For example, such benefits are particularly relevant for customers operating under tight space constraints or in regions with adverse environmental conditions where mechanical robustness requirements play a key role.

Embodiments of the invention enable greater flexibility by allowing employing the pre-existing sub-station layout. Embodiments of the invention enable to select one or more functionalities to be used, at best technical performances without compromises.

Embodiments of the invention enable a simple and cost-effective manufacturing by employing components of the conventional instrument transformer product portfolio.

BRIEF DESCRIPTION OF THE SEVERAL VIEWS OF THE DRAWING

The invention will now be described in preferred but not exclusive embodiments with reference to the accompanying drawings, wherein.

DESCRIPTION OF THE INVENTION

In the drawings, like reference signs refer to same or similar elements.

Figure 3:
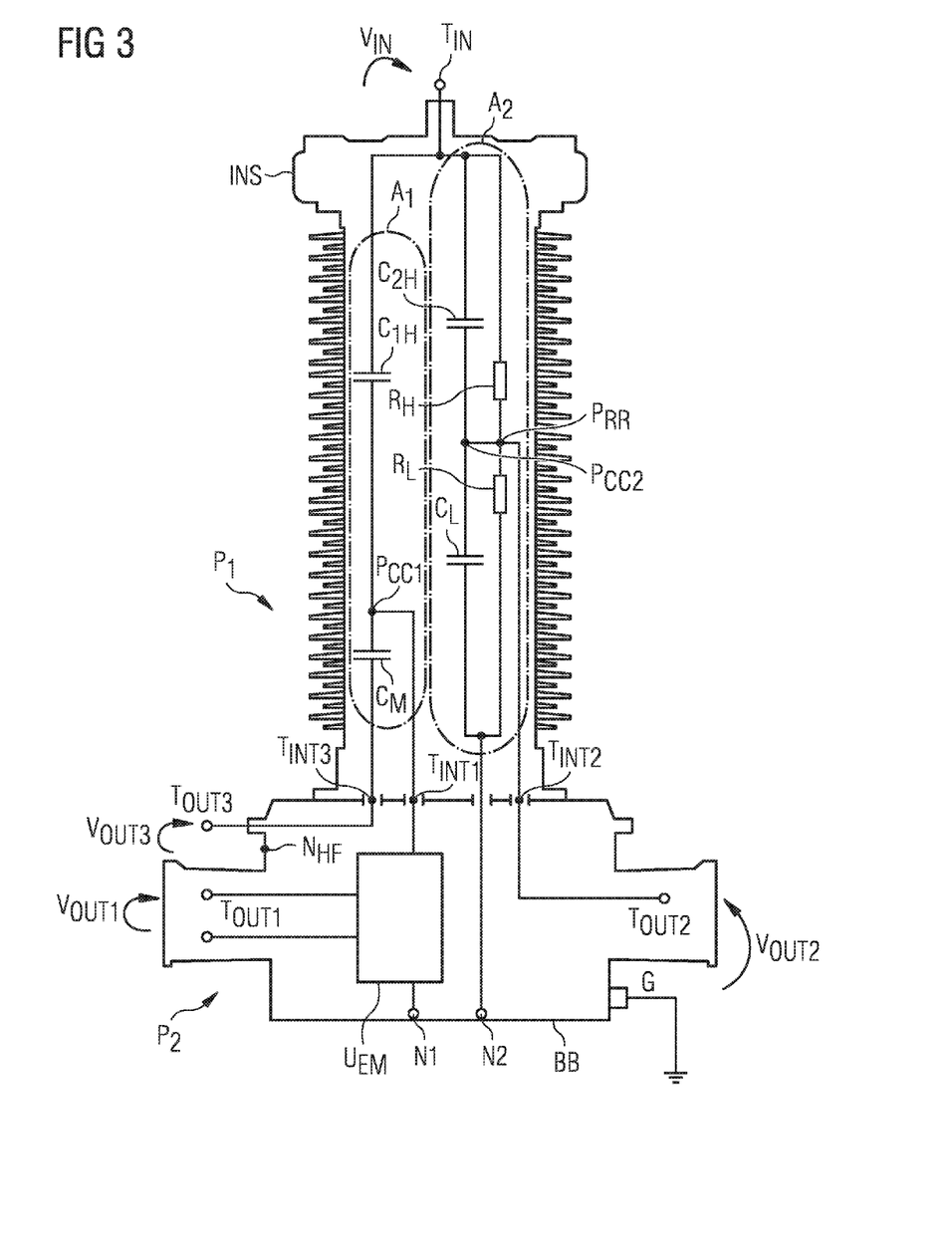
FIG. 3 is a schematic circuit diagram of a HV divider according to an example embodiment of the present invention.

FIG. 3 is a schematic circuit diagram of a HV divider according to an example embodiment of the present invention. At least some embodiments of the present invention addresses the above described issue in which a HV divider for measuring an input high voltage $V_{IN}$ in HV systems has an input terminal $T_{IN}$ to which it is applied the input high voltage $V_{IN}$ and which has an output terminal set $T_{OUT1}$, $T_{OUT2}$ where a set of output voltages $V_{OUT1}$, $V_{OUT2}$ are provided.

The divider comprises a primary part P1 and a secondary part P2 electrically connected to each other so that the output of the primary part P1 is the input of the secondary part P2; wherein the input terminal of the primary part P1 is the divider input terminal $T_{IN}$ and the output the secondary part P2 is the divider output set $T_{OUT1}$, $T_{OUT2}$.

The primary part P1 comprises a first assembly A1 and a second assembly A2 included within insulating means INS and having for input the same input terminal which is the divider input terminal $T_{IN}$. The first assembly A1 is a first capacitor stack comprising a first high voltage capacitor $C_{1H}$ and a middle voltage capacitor $C_M$. The second assembly A2 comprises a second capacitor stack and a resistor stack electrically connected in parallel to each other. The second capacitor stack comprises a second high voltage capacitor $C_{2H}$ and a low voltage capacitor $C_L$. The resistor stack comprises a high voltage resistor $R_H$ and a low voltage resistor $R_L$, both preferably being high accuracy/low inductance resistors. The output of the primary part P1 is a set of intermediary terminals $T_{INT1}$, $T_{INT2}$ comprising at least:
  a first intermediate terminal $T_{INT1}$ connected to a point between the two capacitors $C_{1H}$, $C_M$ of the first capacitor stack;
  a second intermediate terminal $T_{INT2}$ connected to a link connecting a point $P_{CC}$ between the two capacitors $C_{2H}$, $C_L$ of the second capacitor stack and a point $P_{RR}$ between the two resistors $R_H$, $R_L$ of the resistor stack.

The insulating means INS around the two assemblies A1,A2 may be realized through three alternative solutions:
1) An insulating body containing the two assemblies A1,A2; where the insulating body is in the ambient air (Air Insulated Substation AIS).
2) An insulating body containing the two assemblies A1,A2; where the insulating body is inside a gaseous insulating area (e.g. with SF6 gas) contained in a metallic envelope (Gas Insulated Substation GIS).
3) The two assemblies A1,A2 are inside a gaseous insulating area (e.g. with SF6 gas) contained in a metallic envelope (Gas Insulated Substations GIS).

The insulation body may be a cylindrically-shaped porcelain body (with or without sheds) or a fiberglass tube (with or without silicone sheds). The sheds are typically used fur insulating bodies located in AIS substations. The two assemblies A1, A2—when inside the insulator body—are immersed in an insulating material which can be liquid (e.g. oil), gaseous (e.g. SF6) or solid (e.g. resin). It is noted that in latter case, i.e. when the two assemblies A1,A2 are immersed in a solid insulating material like resin, they may not require an insulator body around them since the solid insulating material can act as insulator body.

Moreover, it is noted that the metallic envelope (also called enclosure) of the GIS usually contains other types of substation equipment as well.

Each capacitor may be preferably made by alternating foils of aluminium, paper and/or polypropylene.

One side of the primary part P1 is connected to high voltage, the other side is connected through a bushing to a base-box BB containing the electromagnetic unit $U_{EM}$ and to a terminal block, which may be inside or outside the base-box BB, where the second output terminal $T_{OUT2}$ is provided.

The secondary part P2 comprises an electromagnetic unit $U_{EM}$ and an output terminal set $T_{OUT1}$,$T_{OUT2}$ comprising at least:
- a first output terminal subset $T_{OUT1}$, deriving from the first intermediate terminal $T_{INT1}$ processed through electromagnetic unit $U_{EM}$, arranged to provide a first output voltage subset $V_{OUT1}$ to be used for measuring the amplitude of the input voltage $V_{IN}$ at the nominal frequency range;
- the second output terminal $T_{OUT2}$, deriving from the second intermediate terminal $T_{INT2}$, arranged to provide a second output voltage $V_{OUT2}$ to be used for measuring the waveform of the input high voltage $V_{IN}$.

In one invention embodiment, the electromagnetic unit $U_{EM}$ may comprise at least an inductive middle voltage transformer $T_{IMV}$, a compensation reactor REACT and a filter circuit FILT.

In one invention embodiment, the HV divider may advantageously comprise:
- a third intermediate terminal $T_{INT3}$ connected to the output terminal of the first assembly A1;
- a third output terminal $T_{OUT3}$, deriving from the third intermediate terminal $T_{INT3}$, arranged to provide a first out voltage $V_{OUT3}$ to be used for HF communication.

The first and third output terminal $T_{OUT1}$,$T_{OUT3}$ are the terminals providing the functionalities typical of conventional CVTs, the first terminal subset $T_{OUT1}$ is used for connection of carrier frequency equipment (e.g. for measuring and protecting purposes) and the third terminal $T_{OUT3}$ is used for HF communication.

The second output terminal $T_{OUT2}$ is providing the functionality typical of RCDs, e.g. harmonics measurement. It may also be advantageously used by the customers for connection of low-voltage-power equipment.

FIG. 4 is a schematic illustration of two different example embodiments of the physical realization of the two capacitor stacks.

Figure 4A:
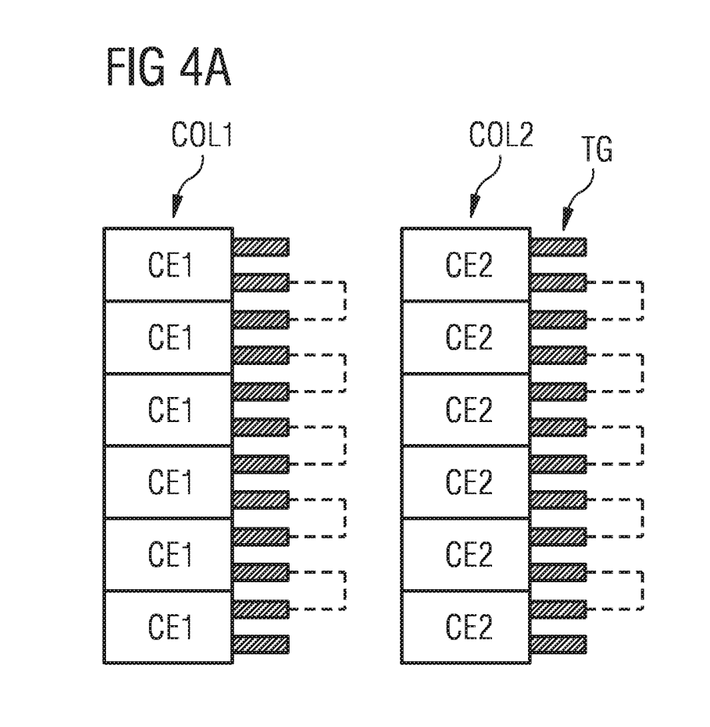
FIG. 4 is a schematic illustration of two different example embodiments of the physical realization of the two capacitor stacks.

In a first embodiment, as illustrated in FIG. 4a, the first capacitor stack and the second capacitor stack are physically realized through two different column arrangements COL1, COL2. The first column arrangement COL1 comprises a set of first-stack capacitor elements CE1 physically stacked together one above the other and electrically connected. The second column arrangement COL2 includes a set of second-stack capacitor elements CE2 physically stacked together one above the other and electrically connected. The electrical connections, as shown by the dashed line connecting the capacitor elements tags TG, may preferably be connections in series. In other embodiments, the electrical connections may be parallel connections or a combination of series and parallel.

Figure 4B:
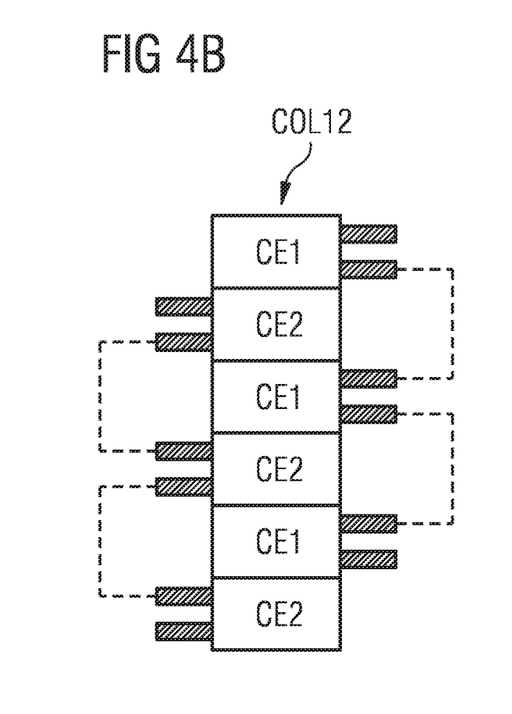

In a second embodiment, as illustrated in FIG. 4b, the first capacitor stack and the second capacitor stack are physically realized in one single column arrangement COL12. Such single column arrangement includes a number of capacitor elements CE1,CE2 belonging to both capacitor stacks. In the single column arrangement COL12, the capacitor elements of both capacitor stacks are physically stacked together one above the other together and only the capacitor elements CE1,CE2 belonging to the same capacitor stack are electrically connected, as shown by the dashed line connecting capacitor elements. The electrical connections, as shown by the dashed line connecting the capacitor elements tags TG, may preferably be connections in series. In other embodiments, the electrical connections may be parallel connections or a combination of series and parallel. The electrical connection of capacitor elements of the same capacitor stack is implemented via a given mixing rule. In one example embodiment, as the one illustrated in FIG. 4b, the mixing rule may be connecting the capacitor elements in an alternating sequence. As the skilled in the art easily appreciates one may implement other types of mixing rules to electrically connect the capacitor elements CE1, CE2: e.g. mixing rules with alternating tuples (single, pairs, triples and so on or any combination thereof) of capacitor elements CE1, CE2 electrically connected together each to form one of the two corresponding capacitor stacks.

The advantage of the first embodiment is that the simple design of electrical connections among capacitor elements is easy to implement so as to obtain manufacturing cost savings.

The advantage of the second embodiment is that the dimensions and weight of the primary part P1 can be reduced.

In fact, having one single column arrangement COL12 instead of two column arrangements COL1, COL2 leads to volume savings when an insulator body is required also because only one hardware fixing system for the capacitor elements is required instead of two and also because of the typical cylindrical shape of the insulator bodies. As a result, when an insulator body is required, the interstitial space to be filled by the insulating material around the two assemblies A1, A2 is also reduced. Having then less insulating material may advantageously lead to reduced weight of the primary part P1 (e.g. in case of liquid or solid filling) and/or less environmental impact (e.g. in case of oil or of SF6 filling).

It is noted that the reduced environmental impact of equipment is becoming an important customer requirement in countries and regions where regulations impose limitations on the used quantity of oil (ground pollution) and/or of SF6 gas (emission restricted by Kyoto protocol) in equipment.

Moreover, the reduced weight of the primary part P1 leads also to advantages in term of the civil works and installation costs required, especially in AIS substations. In fact a less heavy HV divider requires a simpler and more economic metallic pedestal solution for ground fixing in order to fulfill the same mechanical robustness requirements. Mechanical robustness requirements in AIS substations are a sensitive issue for customers operating in regions with adverse climatic and geological conditions (e.g. strong winds, hurricanes, earthquakes etc.).

Although the invention has been described with particular reference to some preferred embodiments, it will be evident to those skilled in the art, that the present invention is not limited thereto, but further variations and modifications may be applied without departing from the scope of the invention as defined by the annexed claims.

Acronyms of Used Terms
AIS Air Insulated Substation
ANSI American National Standard Institute
CVT Capacitor Voltage Transformer
DC Direct Current
GIS Gas Insulated Substation
HF High Frequency
HV High Voltage
IEC International Electro-technical Commission
LV Low Voltage
MV Middle Voltage
PLC Programmable Logic Controller
RCD Resistor Capacitor Divider

The invention claimed is:

1. An HV divider for stepping down an input high voltage in HV systems, the HV divider comprising:
a divider input terminal at which the input high voltage is applied and a divider output terminal set at which a set of output voltages are provided;
a primary part and a secondary part being electrically connected to each other and each having a respective input and a respective output, said output of said primary part being said input of said secondary part, said input of said primary part being said divider input terminal and said output of said secondary part being said divider output terminal set;
an insulator;
said primary part including a first assembly and a second assembly disposed within said insulator;
said first assembly being a first capacitor stack including a first high voltage capacitor and a middle voltage capacitor defining a point therebetween;
said second assembly including a second capacitor stack and a resistor stack electrically connected in parallel to each other, said second capacitor stack including a second high voltage capacitor and a low voltage capacitor defining a point therebetween, said resistor stack including a high voltage resistor and a low voltage resistor defining a point therebetween;
said output of said primary part being a set of intermediary terminals including at least:
a first intermediate terminal being connected to said point between said capacitors of said first capacitor stack; and
a second intermediate terminal being connected to a link connecting said point between said capacitors of said second capacitor stack and said point between said resistors of said resistor stack;
said secondary part including an electromagnetic unit, and said secondary part divider output terminal set including at least:
a first output terminal subset derived from said first intermediate terminal and processed through said electromagnetic unit to provide a first output voltage subset to be used for measuring an amplitude of the input high voltage at a nominal frequency range; and
a second output terminal subset derived from said second intermediate terminal to provide a second output voltage to be used for measuring a waveform of the input high voltage.

2. The HV divider according to claim 1, wherein:
said first assembly has an output terminal;
a third intermediate terminal is connected to said output terminal of said first assembly; and
a third output terminal is derived from said third intermediate terminal to provide a third output voltage to be used for high frequency communications.

3. The HV divider according to claim 1, wherein:
said first capacitor stack and said second capacitor stack are physically realized as first and second different column configurations;
said first column configuration includes a set of first-stack capacitor elements physically stacked together one above the other and electrically interconnected; and
said second column configuration includes a set of second-stack capacitor elements physically stacked together one above the other and electrically interconnected.

4. The HV divider according to claim 1, wherein:
said first capacitor stack and said second capacitor stack are physically realized as one single column configuration;
said single column configuration includes a plurality of capacitor elements belonging to both capacitor stacks;
said capacitor elements of both capacitor stacks are physically stacked together one above the other; and
only said capacitor elements belonging to the same capacitor stack are electrically interconnected.

5. The HV divider according to claim 1, wherein said electromagnetic unit includes at least an inductive middle voltage transformer, a compensation reactor and a filter circuit.

* * * * *